United States Patent
Danno

(10) Patent No.: US 10,094,044 B2
(45) Date of Patent: Oct. 9, 2018

(54) SIC SINGLE CRYSTAL AND METHOD FOR PRODUCING SAME

(71) Applicant: TOYOTA JIDOSHA KABUSHIKI KAISHA, Toyota-shi, Aichi-ken (JP)

(72) Inventor: Katsunori Danno, Obu (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 15/366,619

(22) Filed: Dec. 1, 2016

(65) Prior Publication Data

US 2017/0167049 A1    Jun. 15, 2017

(30) Foreign Application Priority Data

Dec. 15, 2015   (JP) ................................. 2015-244233

(51) Int. Cl.
| | |
|---|---|
| *C30B 19/06* | (2006.01) |
| *C30B 19/04* | (2006.01) |
| *C30B 19/12* | (2006.01) |
| *C30B 29/36* | (2006.01) |
| *C30B 29/64* | (2006.01) |

(52) U.S. Cl.
CPC ............ *C30B 19/068* (2013.01); *C30B 19/04* (2013.01); *C30B 19/062* (2013.01); *C30B 19/12* (2013.01); *C30B 29/36* (2013.01); *C30B 29/64* (2013.01)

(58) Field of Classification Search
CPC ....................................................... C30B 19/04
USPC ........................................................ 428/66.7
See application file for complete search history.

(56) References Cited

U.S. PATENT DOCUMENTS

2015/0013590 A1*   1/2015 Kado ..................... C30B 29/36
                                                                    117/60

FOREIGN PATENT DOCUMENTS

| JP | 2002-356397 A | 12/2002 |
|---|---|---|
| JP | 2008290889 A | 12/2008 |
| JP | 2011016703 A | 1/2011 |
| JP | 2011219296 A | 11/2011 |
| JP | 2013112543 A | 6/2013 |
| JP | 2013-147397 A | 8/2013 |
| JP | 2014234342 A | 12/2014 |
| JP | 2016-056059 A | 4/2016 |

* cited by examiner

Primary Examiner — Brent T O'Hern
(74) Attorney, Agent, or Firm — Oliff PLC

(57) ABSTRACT

A SiC single crystal comprising no polycrystals, and no cracking other than at the side edges is provided. A method for producing SiC single crystal in which seed crystal held at bottom end face of holding shaft is contacted with Si—C solution having temperature gradient to grow SiC single crystal, wherein the contour of the end face of the holding shaft is smaller than the contour of the top face of the seed crystal, the top face of the seed crystal has center section held in contact with the entire surface of the end face of the holding shaft and outer peripheral section that is not in contact with the end face of the holding shaft, and carbon sheet is disposed on the top face of the seed crystal so as to cover at least the outer peripheral section, among the center section and the outer peripheral section.

8 Claims, 6 Drawing Sheets

SIC SINGLE CRYSTAL AND METHOD FOR PRODUCING SAME

TECHNICAL FIELD

The present disclosure relates to a SiC single crystal and to a method for producing it.

BACKGROUND ART

SiC single crystals are thermally and chemically very stable, superior in mechanical strengths, and resistant to radiation, and also have superior physical properties, such as high breakdown voltage and high thermal conductivity, compared to Si single crystals. They are therefore able to exhibit high output, high frequency, voltage resistance and environmental resistance that cannot be realized with existing semiconductor materials, such as Si single crystals and GaAs single crystals, and are being considered ever more promising as next-generation semiconductor materials for a wide range of applications including power device materials that allow high power control and energy saving to be achieved, device materials for high-speed large volume information communication, high-temperature device materials for vehicles, radiation-resistant device materials and the like.

Typical processes for growing SiC single crystals that are known in the prior art include gas phase processes, the Acheson processes, and solution processes. Among gas phase processes, for example sublimation processes have a drawback in that grown single crystals have been prone to hollow penetrating defects known as "micropipe defects", lattice defects, such as stacking faults, and generation of polymorphic crystals. However, most SiC bulk single crystals are conventionally produced by sublimation processes, with attempts being made to reduce defects in the grown crystals. In the Acheson processes, heating is carried out in an electric furnace using silica stone and coke as starting materials, and therefore it has not been possible to obtain single crystals with high crystallinity due to impurities in the starting materials.

Solution processes are processes in which molten Si or a metal other than Si melted in molten Si is formed in a graphite crucible and C is dissolved into the molten liquid, and a SiC crystal layer is deposited and grown on a seed crystal substrate set in the low temperature section. Solution processes are most promising for reducing defects since crystal growth is carried out in a state of near thermal equilibrium, compared to gas phase processes. Recently, therefore, methods for producing SiC single crystals by solution processes have been proposed (PTL 1).

CITATION LIST

Patent Literature

[PTL 1] Japanese Unexamined Patent Publication No. 2014-234342

SUMMARY OF THE INVENTION

Problems to be Solved by the Invention

In the prior art, such as PTL 1, however, cracks may be formed throughout a grown crystal, or polycrystals may be generated. In regarding to cracking, a level of cracking at the side edges within about 1 mm from the sides of a grown crystal is permissible, but cracking throughout a grown crystal has led to fissuring of the grown crystal. The difference in thermal expansion between a seed crystal substrate and a seed crystal holding shaft is known to be a cause of cracking. Moreover, when the contour at the top face of a seed crystal substrate is larger than the contour of the end face of a seed crystal holding shaft, the outer peripheral section of the top face of the seed crystal substrate (the side held by the seed crystal holding shaft) fails to contact the end face of the seed crystal holding shaft, which is known to lead to more radiative heat loss from the non-contacting sections, and possible generation of polycrystals in the grown crystal.

Therefore, a SiC single crystal which comprises no polycrystals and no cracking other than at the side edges is desired.

Means for Solving the Problems

The present disclosure relates to a method for producing a SiC single crystal in which a seed crystal substrate held at a bottom end face of a seed crystal holding shaft is contacted with a Si—C solution situated in a crucible and having a temperature gradient such that the temperature decreases from the interior toward the liquid surface level, for crystal growth of a SiC single crystal, wherein a top face of the seed crystal substrate has a center section held in contact with an entire surface of the bottom end face of the seed crystal holding shaft, and an outer peripheral section that is not in contact with the bottom end face of the seed crystal holding shaft, and a carbon sheet is disposed on the top face of the seed crystal substrate so as to cover at least the outer peripheral section, among the center section and the outer peripheral section.

The present disclosure also relates to a SiC single crystal comprising no polycrystals, comprising no cracking other than at the side edges, having a diameter of 30 mm or greater, and having a deviation in the crystal orientation of no more than 0.22° per 50 mm, as measured by X-ray diffraction.

Effect of the Invention

According to the present disclosure it is possible to obtain a SiC single crystal comprising no polycrystals and comprising no cracking other than at the side edges.

DESCRIPTION OF EMBODIMENTS

Throughout the present specification, the indication "-1" in an expression, such as "(000-1) face", is used where normally a transverse line is placed over the numeral.

Figure 2:
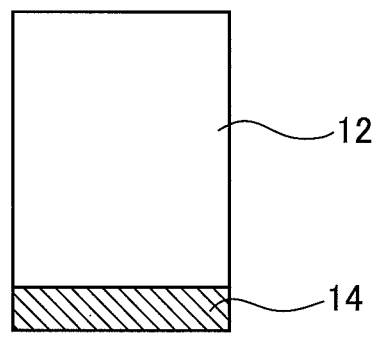
FIG. 2 is a cross-sectional schematic drawing of a seed crystal substrate and a seed crystal holding shaft having the same diameter as the seed crystal substrate.

Growth of a SiC single crystal by a solution process has conventionally employed a seed crystal holding shaft and a seed crystal substrate having the same diameter, such as shown in FIG. 2. FIG. 2 is a cross-sectional schematic drawing of a seed crystal holding shaft 12 and a seed crystal substrate 14 having the same diameter as the seed crystal holding shaft 12. The top face of the seed crystal substrate 14 is held at the bottom end face of the seed crystal holding shaft 12. The present inventor has found that when using a seed crystal holding shaft and a seed crystal substrate having the same diameter as shown in FIG. 2, cracking may occur throughout the grown crystal due to the difference in thermal expansion coefficient of the seed crystal holding shaft and seed crystal substrate. In particular, the present inventor has also found that when a seed crystal substrate having a large diameter is used to grow a large diameter crystal, cracking tends to occur throughout the grown crystal.

Figure 3:
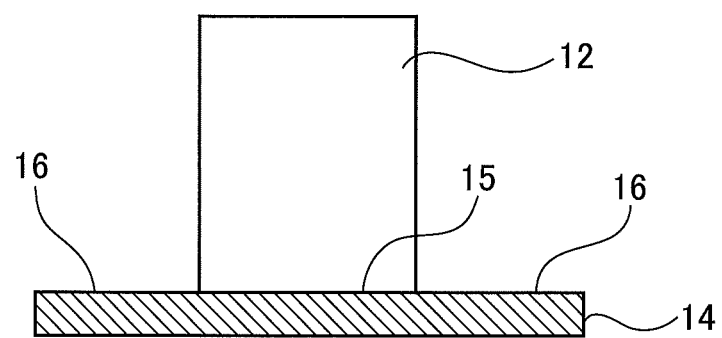
FIG. 3 is a cross-sectional schematic drawing of a seed crystal substrate and a seed crystal holding shaft having a smaller diameter than the seed crystal substrate.

Furthermore, the present inventor has also found that by using a seed crystal holding shaft 12 having a smaller diameter than the diameter of the seed crystal substrate 14, as shown in FIG. 3, it is possible to inhibit generation of cracks that are produced throughout the grown crystal, but that polycrystals may be formed in the grown crystal. FIG. 3 is a cross-sectional schematic drawing of a seed crystal holding shaft 12 and a seed crystal substrate 14 having a larger diameter than the seed crystal holding shaft 12. The center section of the top face of the seed crystal substrate 14 is held in contact with the entire bottom end face of the seed crystal holding shaft 12. It has been found that, when using a seed crystal holding shaft 12 having an end face with a smaller diameter than the diameter of the top face of the seed crystal substrate 14, as shown in FIG. 3, only the center section 15 of the top face of the seed crystal substrate 14 (the side held by the seed crystal holding shaft) is held in contact with the entire surface of the bottom end face of the seed crystal holding shaft 12, while the outer peripheral section 16 of the top face of the seed crystal substrate 14 is not in contact with the bottom end face of the seed crystal holding shaft 12, and radiative heat loss from this outer peripheral section 16 (non-contacting section) is considerable, resulting in a too large temperature gradient of the Si—C solution near the growth surface of the seed crystal substrate 14, potentially leading to polycrystal formation in the grown crystal. In the present application, the section of the seed crystal substrate that is held in contact with the entire surface of the bottom end face of the seed crystal holding shaft will be referred to as the "center section" or "contacting section", and the section not in contact with the bottom end face of the seed crystal holding shaft will be referred to as the "outer peripheral section" or "non-contacting section".

Figure 4:
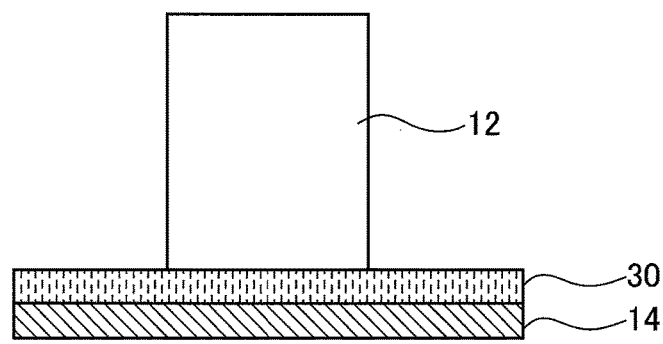
FIG. 4 is a cross-sectional schematic drawing of a seed crystal substrate wherein the top face of the seed crystal substrate is covered with a carbon sheet, and a seed crystal holding shaft having a smaller diameter than the seed crystal substrate.
Figure 5:
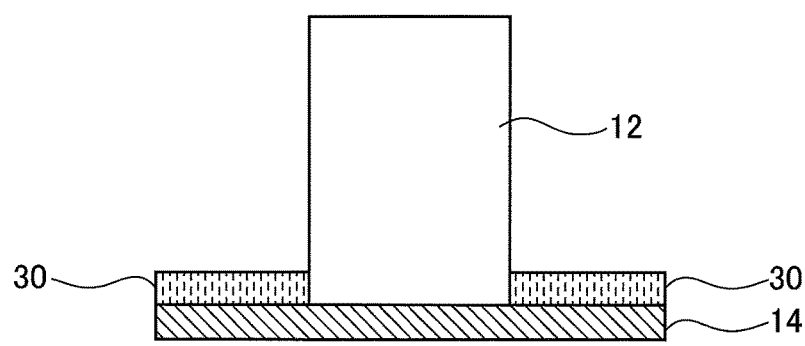
FIG. 5 is a cross-sectional schematic drawing of a seed crystal substrate wherein the outer peripheral section of the top face of the seed crystal substrate is covered with a carbon sheet, and a seed crystal holding shaft having a smaller diameter than the seed crystal substrate.

The present inventor has found, based on the above knowledge, that if a carbon sheet 30 is situated on the top face of the seed crystal substrate 14 so that the outer peripheral section, as the non-contacting section, is not exposed, as shown in FIG. 4 and FIG. 5, it is possible to minimize generation of polycrystals in the grown crystal.

FIG. 4 is a cross-sectional schematic drawing of a seed crystal holding shaft 12, a seed crystal substrate 14 having a larger diameter than the seed crystal holding shaft 12, and a carbon sheet 30 situated on the center section and outer peripheral section on the top face of the seed crystal substrate 14. In FIG. 4, the carbon sheet 30 is situated on the top face of the seed crystal substrate 14, and the seed crystal substrate 14 with the top face covered by the carbon sheet 30 is held at the bottom end face of the seed crystal holding shaft 12.

FIG. 5 is a cross-sectional schematic drawing of a seed crystal holding shaft 12, a seed crystal substrate 14 having a larger diameter than the seed crystal holding shaft 12, and a carbon sheet 30 situated on the outer peripheral section on the top face of the seed crystal substrate 14. In FIG. 5, the carbon sheet 30 is situated on the outer peripheral section of the top face of the seed crystal substrate 14, and the seed crystal substrate 14 is held at the bottom end face of the seed crystal holding shaft 12.

The carbon sheet 30 may be situated so as to lie between the top face of the seed crystal substrate 14 and the bottom end face of the seed crystal holding shaft 12, as shown in FIG. 4, and it may have a donut shape with a hole running through the seed crystal holding shaft at the center section, and covering only the outer peripheral section of the seed crystal substrate 14, as shown in FIG. 5.

The present disclosure relates to a method for producing a SiC single crystal in which a seed crystal substrate held at a bottom end face of a seed crystal holding shaft is contacted with a Si—C solution situated in a crucible and having a temperature gradient such that the temperature decreases from the interior toward the liquid surface level, for crystal growth of a SiC single crystal, wherein a top face of the seed crystal substrate has a center section held in contact with an entire surface of the bottom end face of the seed crystal holding shaft, and an outer peripheral section that is not in contact with the bottom end face of the seed crystal holding shaft, and a carbon sheet is disposed on the top face of the seed crystal substrate so as to cover at least the outer peripheral section, among the center section and the outer peripheral section.

According to the method of the present disclosure, the outer peripheral section, which is the non-contacting section of the top face of the seed crystal substrate 14, is covered with a carbon sheet 30, whereby radiative heat loss from the outer peripheral section can be reduced, and it is thus possible to obtain a SiC single crystal comprising no polycrystals and comprising no cracking other than at the side edges. Naturally, the scope of the present invention encompasses any case where the outer peripheral section as the non-contacting section of the top face of the seed crystal substrate 14 is substantially covered by the carbon sheet.

The method for producing the SiC single crystal according to the present disclosure employs the solution process. The solution process is a process for growing a SiC single crystal in which a SiC seed crystal substrate is contacted with a Si—C solution having a temperature gradient such that the temperature decreases from the interior toward the surface (liquid surface level), to grow a SiC single crystal. By forming a temperature gradient in which the temperature decreases from the interior of the Si—C solution toward the surface of the solution, the surface region of the Si—C solution becomes supersaturated and a SiC single crystal is grown from the seed crystal substrate contacting with the Si—C solution.

Figure 1:
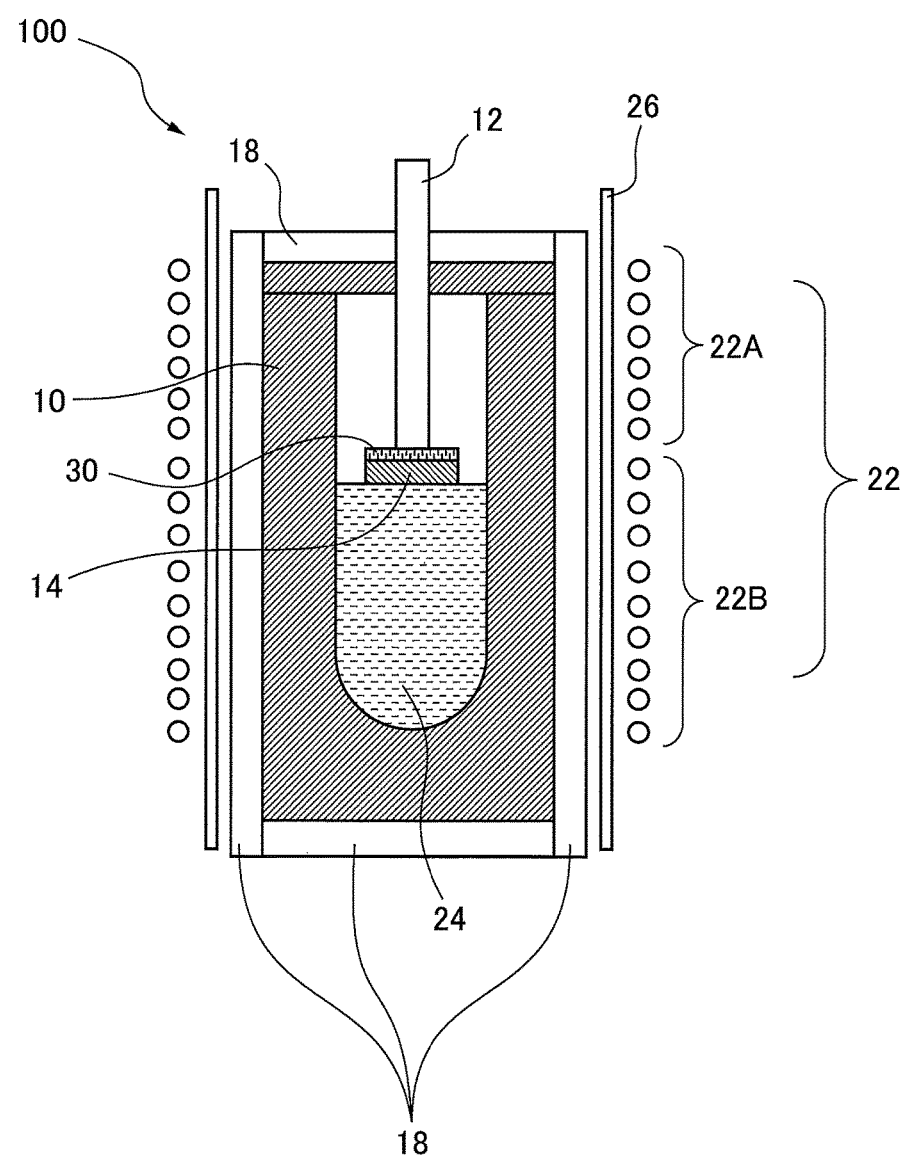
FIG. 1 is a cross-sectional schematic drawing showing an example of a SiC single crystal production apparatus that may be used in the method of the present disclosure.

FIG. 1 shows an example of a cross-sectional schematic drawing of a SiC single crystal production apparatus that may be used in the production method of the present disclosure. The illustrated SiC single crystal production apparatus 100 comprises a crucible 10, wherein the crucible 10 receives a Si—C solution 24 having C dissolved in a molten liquid of Si or Si/X (X being one or more metals other than Si), a temperature gradient is formed in which the temperature is decreased from the interior of the Si—C solution toward the liquid surface level of the solution, and the seed crystal substrate 14, on which the carbon sheet 30 is situated, that is held at the bottom end face of the vertically movable seed crystal holding shaft 12 is contacted with the Si—C solution 24, to allow growth of the SiC single crystal from the seed crystal substrate 14.

The seed crystal substrate 14 used may be a SiC single crystal having quality commonly used for production of SiC single crystals. For example, a SiC single crystal commonly formed by a sublimation process may be used as the seed crystal substrate, and the seed crystal substrate may have any desired shape, such as plate-like, discoid, cylindrical, columnar, truncated circular conic or truncated pyramidal.

Figure 6:
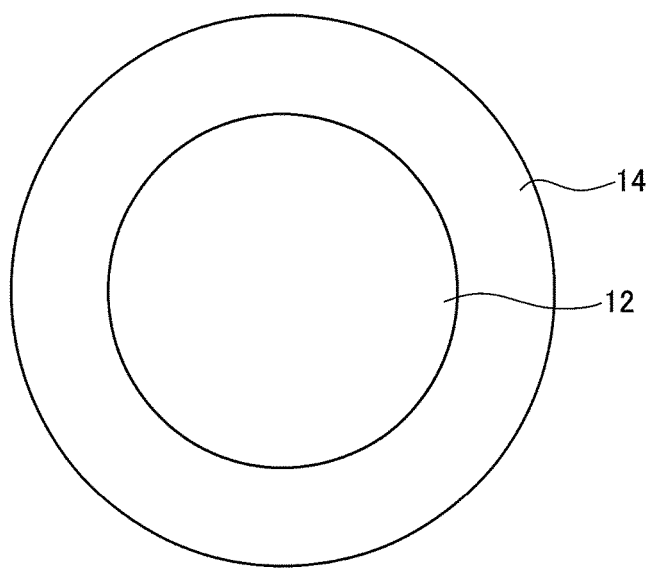
FIG. 6 is a schematic diagram showing the relationship between the sizes of the contour of the top face of the seed crystal substrate and the contour of the end face of the seed crystal holding shaft, as seen from the upward vertical direction.

The seed crystal holding shaft 12 is a shaft that holds the seed crystal substrate 14 on its end face, and it may be a graphite shaft, having any desired shape, such as cylindrical or columnar. The seed crystal holding shaft 12 is used that comprises a bottom end face having a smaller area than the area of the top face of the seed crystal substrate 14. Preferably, as shown in FIG. 6, the top face of the seed crystal substrate 14 is held at the bottom end face of the seed crystal holding shaft 12, in such a manner that the entire contour of the end face of the seed crystal holding shaft 12 is inside the contour on the top face of the seed crystal substrate 14, as viewed from the upward vertical direction.

The seed crystal substrate preferably has a disc shape, and the seed crystal holding shaft preferably has a cylindrical shape. If the seed crystal substrate has a disc shape and the seed crystal holding shaft has a cylindrical shape, the diameter of the seed crystal substrate is preferably 30 mm or greater, and the diameter of a cross-section of the seed crystal holding shaft in the direction perpendicular to the axial direction (hereunder also referred to as the diameter of the seed crystal holding shaft) is preferably no greater than 25 mm. If the diameter of the seed crystal substrate is 30 mm or greater, and the diameter of the seed crystal holding shaft is the same as the diameter of the seed crystal substrate, distortion of the seed crystal substrate will increase when the seed crystal substrate is held on the seed crystal holding shaft, but by making the diameter of the seed crystal holding shaft 25 mm or smaller, it is possible to reduce distortion of the seed crystal substrate produced by the difference in thermal expansion between the seed crystal substrate and the seed crystal holding shaft, and to minimize cracking that is produced throughout the grown crystal. It is sufficient if the diameter of the seed crystal holding shaft is 25 mm or smaller even if the diameter of the seed crystal substrate is increased in a range of 30 mm or greater. The lower limit for the diameter of the seed crystal holding shaft is not particularly restricted so long as it can hold the seed crystal substrate, and it may be 5 mm or greater, for example. The upper limit for the diameter of the seed crystal substrate is not particularly restricted, but may be up to 300 mm, for example.

By making the diameter of the disc-shaped seed crystal substrate 30 mm or greater and the diameter of the cylindrical seed crystal holding shaft 25 mm or smaller, it will be possible to obtain a SiC grown crystal with a large diameter of 30 mm or greater and low distortion, and preferably it will be possible to obtain a SiC grown crystal with deviation in the crystal orientation of less than 0.30°, preferably 0.22° or less, more preferably 0.17° or less and even more preferably 0.11° or less per 50 mm, as measured by X-ray diffraction for the growth surface. The deviation in crystal orientation is preferably the relative crystal orientation obtained by a diffraction vector of g=11-28 or 11-20.

A SiC single crystal with such a low deviation in crystal orientation has low distortion, such that cracking produced throughout the SiC single crystal that is grown can be minimized, and it will be resistant to cracking and fissuring even when it is subjected to working, such as slicing after crystal growth. For the purpose of the present disclosure, cracking that occurs only at the side edges of the grown crystal is permitted so long as cracking throughout the entire SiC single crystal that is grown can be minimized, but preferably cracking is also minimized at the side edges of the grown crystal. In the present application, the "side edges" are the edge regions within 1 mm from the sides of the grown crystal. The diameter of the grown crystal is preferably 30 mm or greater, more preferably 40 mm or greater and even more preferably 45 mm or greater. There is no particular upper limit on the diameter of the grown crystal, but it may be up to 400 mm, for example.

FIG. 4 is a cross-sectional schematic drawing of an embodiment of a seed crystal holding shaft 12 holding a seed crystal substrate 14 in the method of the present disclosure. The carbon sheet 30 is situated on the top face of the seed crystal substrate, in such a manner as to cover at least the outer peripheral section, among the center section of the top face of the seed crystal substrate 14 held at the bottom end face of the seed crystal holding shaft 12, and the outer peripheral section of the top face of the seed crystal substrate 14 that is not in contact with the bottom end face of the seed crystal holding shaft 12. By situating the carbon sheet 30 in this manner, it is possible to reduce radiative heat loss from the outer peripheral section which is the non-contacting section of the seed crystal substrate 14.

The carbon sheet 30 may have a contour that is equal to or larger than the contour of the top face of the seed crystal substrate 14.

Figure 7:
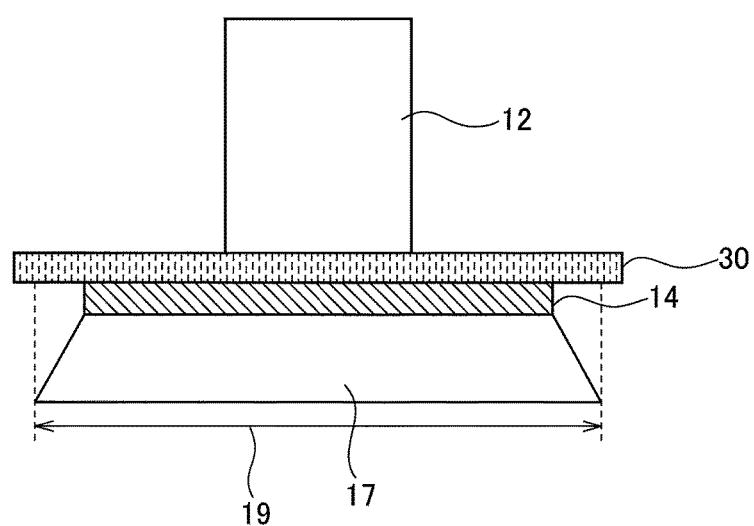
FIG. 7 is a cross-sectional schematic drawing of a seed crystal substrate covered by a carbon sheet having a larger contour than the top face of the seed crystal substrate, and a seed crystal holding shaft having a smaller diameter than the seed crystal substrate.

FIG. 7 shows a cross-sectional schematic drawing of a seed crystal substrate 14 having the top face covered by a carbon sheet having a larger contour than the contour of the top face of the seed crystal substrate 14, and a seed crystal holding shaft 12 having a smaller diameter than the seed crystal substrate 14. As shown in FIG. 7, the carbon sheet 30 preferably has a larger contour than the contour of the top face of the seed crystal substrate 14, and is disposed on the top face of the seed crystal substrate so as to cover the entirety of the center section and the outer peripheral section of the top face of the seed crystal substrate 14. The carbon sheet 30 more preferably has a contour that is equal to or larger than the contour 19 at the growth surface of the SiC single crystal 17 that is to be grown, and covers the entire center section and outer peripheral section of the top face of the seed crystal substrate 14, and as seen from the upward vertical direction, it is disposed on the top face of the seed crystal substrate 14 so as to cover the entire contour 19 of the growth surface of the SiC single crystal 17 that is to be grown.

When the carbon sheet 30 has a larger contour than the contour of the top face of the seed crystal substrate 14, the carbon sheet 30 has a diameter of preferably 3 to 30 mm, more preferably 5 to 20 mm and even more preferably 7 to 15 mm larger than the diameter of the seed crystal substrate.

The carbon sheet 30 may be composed of multiple layers, and for example, a carbon sheet with a larger contour than the contour of the seed crystal substrate 14 may be situated on a carbon sheet having the same contour as the top face of the seed crystal substrate 14.

The carbon sheet 30 may be anchored by bonding with the bottom end face of the seed crystal holding shaft 12 and the top face of the seed crystal substrate 14 by using an adhesive. Holding of the seed crystal substrate 14 at the bottom end face of the seed crystal holding shaft 12 through the carbon sheet 30 may also be accomplished by using an adhesive. When the seed crystal holding shaft 12 and the seed crystal substrate 14 are bonded through the carbon sheet 30, it is possible to more easily and stably hold the seed crystal substrate 14 than by directly holding the seed crystal substrate 14 on the seed crystal holding shaft 12, and therefore the carbon sheet 30 is preferably situated so as to be lying between the top face of the seed crystal substrate 14 and the bottom end face of the seed crystal holding shaft 12.

The adhesive is preferably a carbon adhesive. Examples of carbon adhesives include phenol-based adhesives and epoxy-based adhesives.

An adhesive layer composed of an adhesive or having an adhesive as the main component may be placed on both sides of the carbon sheet 30 to produce an adhesive layer/carbon sheet 30/adhesive layer structure.

The carbon sheet 30 is not particularly restricted so long as it can lower radiative heat loss from the outer peripheral section of the seed crystal substrate, and a commercially available one may be used. A carbon sheet can be obtained, for example, by subjecting carbon fibers to a roller for dehydration. Since a carbon sheet has flexibility, it does not cause distortion of the seed crystal substrate or grown crystal even when the carbon sheet is anchored by bonding to the top face of the seed crystal substrate, and it can reduce radiative heat loss from the outer peripheral section which is the non-contacting section of the seed crystal substrate, and can minimize cracking throughout the grown crystal and reduce generation of polycrystals in the grown crystal. While a heat-insulating material, such as a graphite ring with a hole at the center section for the seed crystal holding shaft to pass through, may be used instead of a carbon sheet, but if a heat-insulating material, such as a graphite ring, is bonded to the seed crystal substrate, distortion may occur in the seed crystal substrate or grown crystal, and therefore a carbon sheet is preferred.

Grown crystals may have cracking from the edges, and especially when crystal growth having a large diameter of 30 mm or greater is carried out, it has been found that cracking readily occurs from the sides (edges) of the grown crystal. The sides of the grown crystal are thought to be cooled more easily. If the carbon sheet 30 has an area equal to or larger than the diameter of the grown crystal, the sides of the grown crystal become thermally insulated, allowing cracking at the sides of the grown crystal to be inhibited.

The thickness of the carbon sheet may be a thickness that allows the inhibiting effect on radiative heat loss from the outer peripheral section to be obtained, and it may be 0.01 mm or greater, 0.05 mm or greater or 0.2 mm or greater, for example. The upper limit for the thickness of the carbon sheet is not particularly restricted, and may be up to 10 mm, up to 5 mm or up to 1 mm, for example.

The Si—C solution is a solution in which C is dissolved, where the solvent is a molten liquid of Si or Si/X (X being one or more metals other than Si). X is not particularly restricted so long as it is one or more metals and can form a liquid phase (solution) that is in a state of thermodynamic equilibrium with SiC (the solid phase). Suitable examples of X metals include Ti, Mn, Cr, Ni, Ce, Co, V and Fe. The Si—C solution preferably has a composition comprising Si and Cr.

When the Si—C solution has a composition comprising Si and Cr, a Si—C solution wherein the solvent is a molten liquid of Si/(Si+Cr)=30-80%, as the atomic composition percentage, is preferred since it has low fluctuation in the amount of dissolved C. For example, Si may be added to the crucible, and then Cr and the like may be loaded in to form a Si—Cr solution or the like.

The Si—C solution 24 is prepared by loading the starting materials into the crucible, melting them by heating to prepare Si or Si/X molten liquid, and dissolving C therein. If the crucible 10 is a carbonaceous crucible, such as a graphite crucible, or SiC crucible, C will dissolve into the molten liquid by dissolution of the crucible 10, thereby allowing a Si—C solution to be formed. This will avoid the presence of undissolved C in the Si—C solution 24, and prevent waste of SiC due to deposition of the SiC single crystal onto the undissolved C. The supply of C may be conducted by utilizing a method of, for example, blowing in hydrocarbon gas or loading a solid C source together with the molten liquid starting material, or these methods may be combined together with dissolution of the crucible.

For thermal insulation, the outer periphery of the crucible 10 is covered with a heat-insulating material 18. These are housed together inside a quartz tube 26. A high-frequency coil 22 is disposed around the outer periphery of the quartz tube 26, as a heating device. The high-frequency coil 22 may be configured with an upper level coil 22A and a lower level coil 22B. The upper level coil 22A and lower level coil 22B are independently controllable.

Since the temperatures of the crucible 10, heat-insulating material 18, quartz tube 26 and high-frequency coil 22 become high, they are situated inside a water-cooling chamber. The water-cooling chamber is provided with a gas inlet and a gas exhaust vent to allow atmospheric modification in the apparatus.

The temperature of the Si—C solution 24 usually has a temperature distribution with a lower temperature at the surface of the Si—C solution 24 than the interior thereof due to radiation and the like. Further, a temperature gradient can be formed in the Si—C solution 24 in the direction perpendicular to the surface of the Si—C solution 24 so that an upper portion of the solution contacting the seed crystal substrate 14 is at low temperature and a lower portion of the solution (the interior) is at high temperature, by adjusting the number of coils and spacing of the high-frequency coil 22, the positional relationship of the high-frequency coil 22 and the crucible 10 in the height direction, and the output of the high-frequency coil 22. For example, the output of the upper level coil 22A may be smaller than the output of the lower level coil 22B, to form a temperature gradient in the Si—C solution 24 in which an upper portion of the solution is at low temperature and a lower portion of the solution is at high temperature.

The C that has dissolved in the Si—C solution 24 is dispersed by diffusion and convection. In the vicinity of the bottom surface of the seed crystal substrate 14, a temperature gradient is formed, in which the temperature is lower compared to a lower portion of the Si—C solution 24, by utilizing the power control of the heating apparatus, heat radiation from the surface of the Si—C solution 24 and heat loss through the seed crystal holding shaft 12. When the C that has dissolved into the solution interior that is at high temperature and has high solubility reaches the region near the seed crystal substrate that is at low temperature and has low solubility, a supersaturation state appears and a SiC single crystal is grown on the seed crystal substrate by virtue of supersaturation as a driving force.

Contact of the seed crystal substrate 14 with the Si—C solution may be carried out by lowering the seed crystal holding shaft 12 holding the seed crystal substrate 14 at the bottom end face, toward the liquid surface level of the Si—C solution 24, and contacting it with the Si—C solution 24 while the bottom face of the seed crystal substrate 14 is parallel to the liquid surface level of the Si—C solution 24. The seed crystal substrate 14 may be held at a prescribed position relative to the liquid surface level of the Si—C solution 24 for growth of the SiC single crystal.

Figure 8:
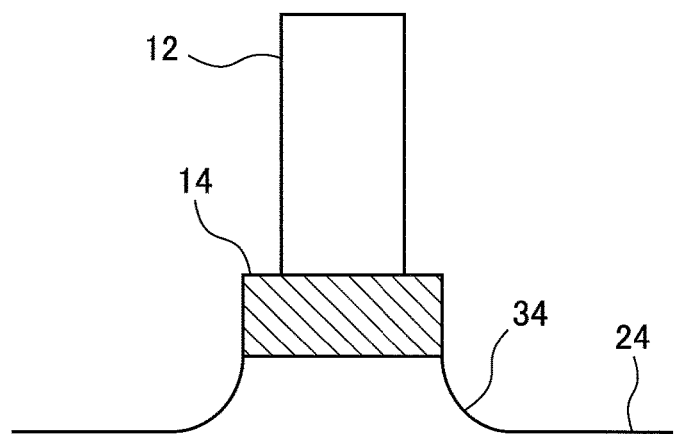
FIG. 8 is a cross-sectional schematic drawing of the meniscus formed between a seed crystal substrate and a Si—C solution.

The holding position of the seed crystal substrate 14 may be such that the position of the bottom face of the seed crystal substrate 14 matches the Si—C solution surface, is below the Si—C solution surface, or is above the Si—C solution surface. As shown in FIG. 8, the position of the bottom face of the seed crystal substrate is preferably above the Si—C solution surface, so that the Si—C solution 24 wets only the bottom face of the seed crystal substrate 14, forming a meniscus 34. FIG. 8 is a cross-sectional schematic drawing of the meniscus 34 formed between a seed crystal substrate 14 and a Si—C solution 24.

When a meniscus is formed, the position of the bottom face of the seed crystal substrate is preferably held at a position 0.5 to 3 mm above the Si—C solution surface. When it is held so that the bottom face of the seed crystal substrate is at a position above the Si—C solution surface, the seed crystal substrate is contacted once with the Si—C solution so that the Si—C solution contacts with the bottom face of the seed crystal substrate, and it is then raised to the prescribed position. Thus, by forming a meniscus and conducting crystal growth, it is possible to avoid contact of the Si—C solution with the seed crystal holding shaft, to more easily prevent generation of polycrystals.

In the method of the present disclosure, the lower limit for the surface temperature of the Si—C solution is preferably 1800° C. or higher and the upper limit is preferably 2200° C., since the dissolution of C in the Si—C solution can be increased within this temperature range.

Temperature measurement of the Si—C solution can be carried out by using a thermocouple or radiation thermometer. From the viewpoint of high temperature measurement and preventing inclusion of impurities, the thermocouple is preferably a thermocouple comprising a tungsten-rhenium wire covered with zirconia or magnesia glass, placed inside a graphite protection tube.

According to one embodiment, meltback may be conducted, in which the surface layer of the seed crystal substrate is dissolved in the Si—C solution and removed prior to growth of a SiC single crystal. Since the surface layer of the seed crystal substrate on which the SiC single crystal is to be grown may have an affected layer, such as a dislocation, a natural oxide film, or the like, removal of the same by dissolution prior to growth of a SiC single crystal is effective for growing a high-quality SiC single crystal. Although the thickness of a layer to be removed depends on processed conditions of the surface of a SiC seed crystal substrate, it is preferably approximately 5 to 50 µm for sufficient removal of an affected layer and a natural oxide layer.

The meltback may be carried out by forming a temperature gradient in which the temperature increases from the interior of the Si—C solution toward the surface of the solution, i.e., by forming, in the Si—C solution, a temperature gradient in a direction opposite to the case of SiC single crystal growth. The temperature gradient in the opposite direction can be formed by regulating the output of the heating device, such as a high-frequency coil.

According to one embodiment, the seed crystal substrate may be preheated in advance, and then the same is contacted with the Si—C solution. If the seed crystal substrate at a low temperature is contacted with the Si—C solution at high temperature, heat shock dislocations may be generated in the seed crystal. Preheating of the seed crystal substrate before contacting the seed crystal substrate with the Si—C solution prevents heat shock dislocation and is effective for growth of a high-quality SiC single crystal. The seed crystal substrate may be heated together with the seed crystal holding shaft. In this case, heating of the seed crystal holding shaft is stopped after contact of the seed crystal substrate with the Si—C solution and before growth of the SiC single crystal. Alternatively, the Si—C solution may be heated to the temperature for crystal growth after contacting the seed crystal with the Si—C solution at a relatively low temperature. This is also effective for preventing heat shock dislocations and growing a high-quality SiC single crystal.

The present disclosure also relates to a SiC single crystal comprising no polycrystals, comprising no cracking other than at the side edges, having a diameter of 30 mm or greater, and having a deviation in the crystal orientation of less than 0.30°, preferably no more than 0.22°, more preferably no more than 0.17°, and even more preferably no more than 0.11° per 50 mm, as measured by X-ray diffraction for the growth surface. The deviation in crystal orientation is preferably the relative crystal orientation obtained by a diffraction vector of g=11-28 or 11-20.

The SiC single crystal of the present disclosure preferably comprises no cracks at the side edges. In this disclosure, the "side edges" are the edge regions within 1 mm from the sides of the grown crystal.

The SiC single crystal of the present disclosure has a diameter of preferably 30 mm or greater, more preferably 40 mm or greater and even more preferably 45 mm or greater. There is no particular upper limit on the diameter of the grown crystal, but it may be up to 400 mm, for example.

EXAMPLES

Example 1

There was prepared a SiC single crystal formed by a sublimation process, which was a discoid 4H—SiC single crystal with a diameter of 40 mm, a thickness of 500 μm, and the bottom face as the (000-1) plane, for use as a seed crystal substrate.

A cylindrical graphite shaft having a diameter of 12 mm and a length of 40 cm, was prepared as a seed crystal holding shaft.

A carbon sheet 30 (GRAFOIL® by Tomoe Engineering Co., Ltd.) was prepared having a thickness of 0.2 mm and an outer shape that was circular with the same diameter of 40 mm as the seed crystal substrate.

As shown schematically in FIG. 4, the carbon sheet 30 was bonded to the top face of the seed crystal substrate using a phenol-based carbon adhesive, so as to completely cover the top face of the seed crystal substrate. Further, the bottom end face of the seed crystal holding shaft was bonded to the center section of the top face of the seed crystal substrate covered with the carbon sheet 30, using a phenol-based carbon adhesive.

A single crystal production apparatus 100 shown in FIG. 1 was used. Si/Cr was loaded as a molten liquid material at an atomic composition percentage of Si:Cr=60:40, into a graphite crucible 10 housing a Si—C solution.

After vacuum suction of the interior of the single crystal production apparatus 100 to $1 \times 10^{-3}$ Pa, argon gas was introduced to 1 atmosphere and the air inside the single crystal production apparatus 100 was exchanged with argon. A high-frequency coil 22 as a heating apparatus situated around the periphery of the graphite crucible 10 was electrified to melt the starting material in the graphite crucible 10 by heating, thereby forming a Si/Cr alloy molten liquid. Then, a sufficient amount of C was dissolved into the Si/Cr alloy molten liquid from the graphite crucible 10 to form a Si—C solution 24.

The outputs of the upper level coil 22A and lower level coil 22B were adjusted to heat the graphite crucible 10 so that the temperature of the surface of the Si—C solution 24 was increased to 2000° C., and an average temperature gradient in which the temperature decreased from the solution interior in a range of 1 cm from the surface of the Si—C solution 24 toward the solution surface, was 30° C./cm. Temperature measurement of the surface of the Si—C solution 24 was conducted with a radiation thermometer, and measurement of the temperature gradient of the Si—C solution 24 was conducted by using a vertically movable thermocouple.

Seed touching was conducted, in which the position of the bottom face of the seed crystal substrate 14 was placed at a position matching the liquid surface level of the Si—C solution 24, and the bottom face of the seed crystal substrate was contacted with the Si—C solution, while keeping the bottom face of the seed crystal substrate 14 that was bonded to the seed crystal holding shaft 12, parallel to the liquid surface level of the Si—C solution 24. The seed crystal holding shaft 12 and seed crystal substrate 14 were then raised 0.5 mm to form a meniscus, and it was held at that position for 15 hours for crystal growth.

Upon completion of the crystal growth, the seed crystal holding shaft 12 was raised and cooled to room temperature, and the seed crystal substrate 14 and the SiC crystal grown from the seed crystal substrate were severed from the Si—C solution 24 and the seed crystal holding shaft 12 and were recovered. The obtained grown crystal had a diameter of 45 mm and a thickness of 1.0 mm. The diameter of the obtained grown crystal is the diameter of the growth surface (same hereunder).

Based on a photomicrograph of the obtained grown crystal taken from the growth surface, there was no poly- crystal generation and a SiC single crystal had been obtained. However, cracking was confirmed at the side edges of the grown crystal. When the growth surface of the grown crystal was measured by X-ray diffraction (XRT-200CCM, product of Rigaku Corp.), the deviation in relative crystal orientation obtained by g=11-28 diffraction was 0.11° per 50 mm.

Example 2

A SiC crystal was grown and recovered under the same conditions as Example 1, except that the crystal growth time was 20 hours.

The obtained grown crystal had a diameter of 49 mm and a thickness of 4.0 mm. Based on a photomicrograph of the grown crystal taken from the growth surface, there was no polycrystal generation and a SiC single crystal had been obtained. However, cracking was confirmed at the side edges of the grown crystal. When the growth surface of the grown crystal was measured by X-ray diffraction, the deviation in relative crystal orientation obtained by g=11-28 diffraction was 0.22° per 50 mm.

Example 3

A SiC crystal was grown and recovered under the same conditions as Example 1, except for using a carbon sheet 30 (GRAFOIL® by Tomoe Engineering Co., Ltd.) having a circular shape with a thickness of 0.2 mm and a diameter of 50 mm.

The obtained grown crystal had a diameter of 46 mm and a thickness of 1.0 mm. Based on a photomicrograph of the grown crystal taken from the growth surface, there was no polycrystal generation and a satisfactory SiC single crystal had been obtained without visible cracking throughout the grown crystal including the side edges. When the growth surface of the grown crystal was measured by X-ray diffraction, the deviation in relative crystal orientation obtained by g=11-28 diffraction was 0.17° per 50 mm.

Comparative Example 1

A SiC crystal was grown and recovered under the same conditions as Example 1, except that the seed crystal substrate used was a SiC single crystal produced by a sublimation process, which was a discoid 4H—SiC single crystal with a diameter of 30 mm, a thickness of 500 μm, and the bottom face having a (000-1) face, the seed crystal holding shaft used was a cylindrical graphite shaft with a diameter of 30 mm and a length of 40 cm, and no carbon sheet was used.

The obtained grown crystal had a diameter of 42 mm and a thickness of 3.6 mm. Based on a photomicrograph of the grown crystal from the growth surface, cracking was formed throughout the grown crystal. When the growth surface of the grown crystal was measured by X-ray diffraction, the deviation in relative crystal orientation obtained by g=11-28 diffraction was 1.3° per 50 mm.

Comparative Example 2

A SiC crystal was grown and recovered under the same conditions as Example 1, except that the seed crystal substrate used was a SiC single crystal produced by a sublimation process, which was a discoid 4H—SiC single crystal with a diameter of 40 mm, a thickness of 500 μm, and the bottom face having a (000-1) face, the seed crystal holding shaft used was a cylindrical graphite shaft with a diameter of 40 mm and a length of 40 cm, and no carbon sheet was used.

The obtained grown crystal had a diameter of 40 mm and a thickness of 4.0 mm. Based on a photomicrograph of the grown crystal from the growth surface, no polycrystal generation was seen, but cracking was formed throughout the grown crystal.

Comparative Example 3

A SiC crystal was grown and recovered under the same conditions as Example 1, except that the seed crystal substrate used was a SiC single crystal produced by a sublimation process, which was a discoid 4H—SiC single crystal with a diameter of 50 mm, a thickness of 500 μm, and the bottom face having a (000-1) face, the seed crystal holding shaft used was a cylindrical graphite shaft with a diameter of 50 mm and a length of 40 cm, and no carbon sheet was used.

The obtained grown crystal had a diameter of 52 mm and a thickness of 3.0 mm. Based on a photomicrograph of the grown crystal from the growth surface, no polycrystal generation was visible, but cracking was formed throughout the grown crystal.

Comparative Example 4

A SiC crystal was grown and recovered under the same conditions as Example 1, except that no carbon sheet was used.

The obtained grown crystal had a diameter of 44 mm and a thickness of 3.0 mm. Based on a photomicrograph of the grown crystal from the growth surface, cracking was visible at the side edges of the grown crystal, and polycrystal generation was also visible. When the growth surface of the grown crystal was measured by X-ray diffraction, the deviation in relative crystal orientation obtained by g=11-28 diffraction was 0.12° per 50 mm.

Comparative Example 5

A SiC crystal was grown and recovered under the same conditions as Example 1, except that the seed crystal substrate used was a SiC single crystal produced by a sublimation process, which was a discoid 4H—SiC single crystal with a diameter of 30 mm, a thickness of 500 μm, and the bottom face having a (000-1) face, the seed crystal holding shaft used was a cylindrical graphite shaft with a diameter of 25 mm and a length of 40 cm, and no carbon sheet was used.

The obtained grown crystal had a diameter of 45 mm and a thickness of 3.1 mm. Based on a photomicrograph of the grown crystal from the growth surface, cracking was visible at the side edges of the grown crystal, and polycrystal generation was also visible. When the growth surface of the grown crystal was measured by X-ray diffraction, the deviation in relative crystal orientation obtained by g=11-28 diffraction was 0.21° per 50 mm.

The crystal growth conditions for Examples 1 to 3 and Comparative Examples 1 to 5 are summarized in Table 1.

TABLE 1

| | Seed crystal holding shaft diameter (mm) | Seed crystal substrate diameter (mm) | Carbon sheet present | Carbon sheet diameter (mmϕ) | Growth time (h) |
|---|---|---|---|---|---|
| Example 1 | 12 | 40 | Yes | 40 | 15 |
| Example 2 | 12 | 40 | Yes | 40 | 20 |
| Example 3 | 12 | 40 | Yes | 50 | 15 |
| Comp. Ex. 1 | 30 | 30 | No | — | 15 |
| Comp. Ex. 2 | 40 | 40 | No | — | 15 |
| Comp. Ex. 3 | 50 | 50 | No | — | 15 |
| Comp. Ex. 4 | 12 | 40 | No | — | 15 |
| Comp. Ex. 5 | 25 | 30 | No | — | 15 |

The diameters, presence of cracking, presence of polycrystals, and plane orientation deviations for the grown crystals obtained in Examples 1 to 3 and Comparative Examples 1 to 5 are summarized in Table 2.

TABLE 2

| | Grown crystal diameter (mm) | Presence of cracking in grown crystal | Polycrystallization present in grown crystal | Plane orientation deviation (°/50 mm) |
|---|---|---|---|---|
| Example 1 | 45 | Only at side edges | No | 0.11 |
| Example 2 | 49 | Only at side edges | No | 0.22 |
| Example 3 | 46 | None | No | 0.17 |
| Comp. Ex. 1 | 42 | Throughout crystal | No | 1.3 |
| Comp. Ex. 2 | 40 | Throughout crystal | No | Not measured |
| Comp. Ex. 3 | 52 | Throughout crystal | No | Not measured |
| Comp. Ex. 4 | 44 | Only at side edges | Yes | 0.12 |
| Comp. Ex. 5 | 45 | Only at side edges | Yes | 0.21 |

(Simulation of Temperature Gradient of Si—C Solution)

The temperature gradient of a Si—C solution during growth of a SiC single crystal by a solution process (Flux method) was simulated using CGSim (solution bulk crystal growth simulation software by STR Japan, Ver. 14.1), based on the conditions in Example 1 and Comparative Example 2 and Comparative Example 4.

For Example 1 and Comparative Example 4, simulation of the temperature gradient in the vertical direction of the Si—C solution was conducted in a range of 1 mm below the growth surface of the seed crystal substrate, directly below the outer peripheral section of the seed crystal substrate. For Comparative Example 2, simulation of the temperature gradient in the vertical direction of the Si—C solution was conducted in a range of 1 mm below the growth surface of the seed crystal substrate, directly below the center section of the seed crystal substrate.

Figure 9:
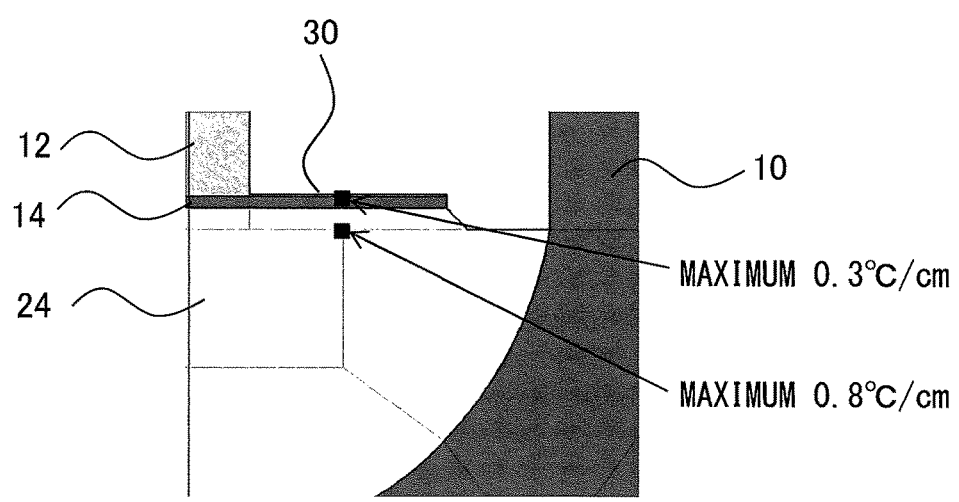
FIG. 9 shows the results of a simulation of a temperature gradient in a Si—C solution, based on the conditions of Example 1.
Figure 10:
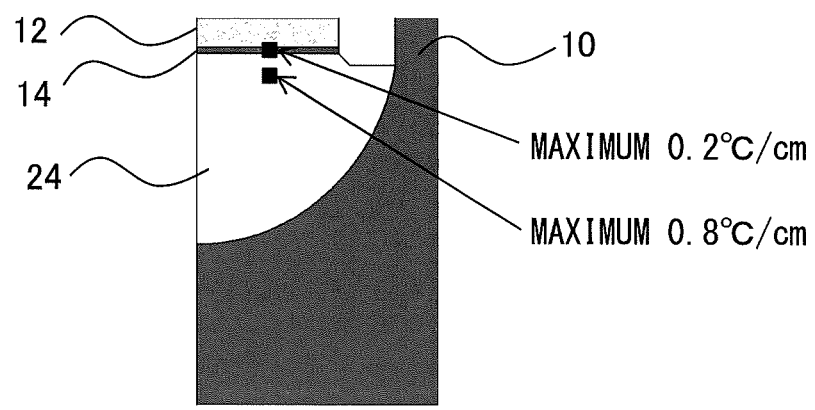
FIG. 10 shows the results of a simulation of a temperature gradient in a Si—C solution, based on the conditions of Comparative Example 2.
Figure 11:
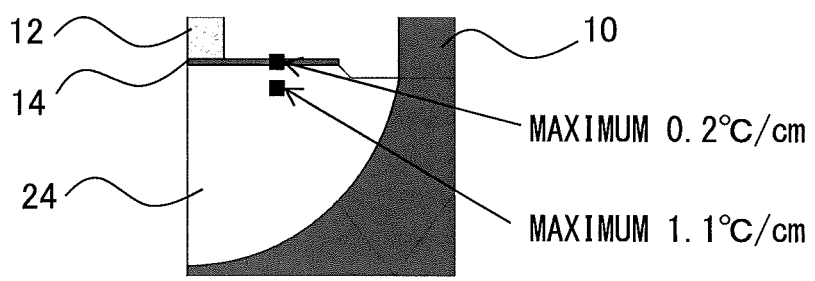
FIG. 11 shows the results of a simulation of a temperature gradient in a Si—C solution, based on the conditions of Comparative Example 4.

FIGS. 9 to 11 and Table 3 show the results for simulation of the temperature gradient of the Si—C solution conducted based on the conditions in Example 1, Comparative Example 2, and Comparative Example 4. The numerical values in FIGS. 9 to 11 and Table 3 are the temperature gradients with the largest values within the horizontal direction, at the outer peripheral section of the seed crystal substrate for Example 1 and Comparative Example 4, and at the center section of the seed crystal substrate for Comparative Example 2. It was confirmed that the temperature gradient of the Si—C solution directly below the outer peripheral section obtained in Example 1 was approximately 30% lower than the temperature gradient of the Si—C solution directly below the outer peripheral section obtained under the conditions of Comparative Example 4, and the same as the temperature gradient directly below the center section obtained under the conditions of Comparative Example 2.

TABLE 3

|  | Temperature gradient (° C./cm) |
|---|---|
| Example 1 | 0.8 |
| Comp. Ex. 2 | 0.8 |
| Comp. Ex. 4 | 1.1 |

EXPLANATION OF SYMBOLS

100 Single crystal production apparatus
10 Crucible
12 Seed crystal holding shaft
14 Seed crystal substrate
15 Center section of seed crystal substrate
16 Outer peripheral section of seed crystal substrate
17 Grown crystal
18 Heat-insulating material
19 Contour of growth surface of grown crystal
22 High-frequency coil
22A Upper level high-frequency coil
22B Lower level high-frequency coil
24 Si—C solution
26 Quartz tube
30 Carbon sheet
34 Meniscus

What is claimed is:

1. A method for producing a SiC single crystal in which a seed crystal substrate held at a bottom end face of a seed crystal holding shaft is contacted with a Si—C solution situated in a crucible and having a temperature gradient such that a temperature decreases from an interior of the Si—C solution toward a liquid surface level of the Si—C solution, for crystal growth of a SiC single crystal,
wherein a top face of the seed crystal substrate has a center section held in contact with an entire surface of the bottom end face of the seed crystal holding shaft, and an outer peripheral section that is not in contact with the bottom end face of the seed crystal holding shaft, and
a carbon sheet is disposed on the top face of the seed crystal substrate so as to be in contact with and cover at least the outer peripheral section, among the center section and the outer peripheral section.

2. The method for producing a SiC single crystal according to claim 1,
wherein the carbon sheet has a contour that is equal to or larger than the contour of the top face of the seed crystal substrate,
the carbon sheet is disposed on the top face of the seed crystal substrate so as to cover the entire center section and outer peripheral section of the top face of the seed crystal substrate, and
the method comprises holding the center section of the seed crystal substrate on which the carbon sheet is disposed, at the bottom end face of the seed crystal holding shaft.

3. The method for producing a SiC single crystal according to claim 1,
wherein the carbon sheet has a contour that is equal to or larger than the contour of the growth surface of the SiC single crystal that is to be grown,
the carbon sheet is disposed on the top face of the seed crystal substrate so as to cover the entire center section and outer peripheral section of the top face of the seed crystal substrate and to cover the entire contour of the growth surface of the SiC single crystal that is to be grown, as viewed from the upward vertical direction, and
the method comprises holding the center section of the seed crystal substrate on which the carbon sheet is disposed, at the bottom end face of the seed crystal holding shaft.

4. The method for producing a SiC single crystal according to claim 1, the method comprising:
holding the center section of the seed crystal substrate at the bottom end face of the seed crystal holding shaft, and
disposing the carbon sheet so as to cover at least a portion of the outer peripheral section of the top face of the seed crystal substrate held at the bottom end face.

5. The method for producing a SiC single crystal according to claim 1,
wherein the seed crystal substrate has a disc shape and a diameter of the seed crystal substrate is 30 mm or greater, and
the seed crystal holding shaft has a cylindrical shape and a diameter of the seed crystal holding shaft is 25 mm or smaller.

6. The method for producing a SiC single crystal according to claim 2,
wherein the seed crystal substrate has a disc shape and a diameter of the seed crystal substrate is 30 mm or greater, and
the seed crystal holding shaft has a cylindrical shape and a diameter of the seed crystal holding shaft is 25 mm or smaller.

7. The method for producing a SiC single crystal according to claim 3,
wherein the seed crystal substrate has a disc shape and a diameter of the seed crystal substrate is 30 mm or greater, and
the seed crystal holding shaft has a cylindrical shape and a diameter of the seed crystal holding shaft is 25 mm or smaller.

8. The method for producing a SiC single crystal according to claim 4,
wherein the seed crystal substrate has a disc shape and a diameter of the seed crystal substrate is 30 mm or greater, and
the seed crystal holding shaft has a cylindrical shape and a diameter of the seed crystal holding shaft is 25 mm or smaller.

* * * * *